(12) United States Patent
Teng et al.

(10) Patent No.: US 7,908,108 B2
(45) Date of Patent: Mar. 15, 2011

(54) CIRCUIT TESTING APPARATUS

(75) Inventors: Cheng-Yung Teng, Taipei County (TW); Li-Jieu Hsu, Taipei (TW)

(73) Assignee: Princeton Technology Corporation, Taipei County (TW)

( * ) Notice: Subject to any disclaimer, the term of this patent is extended or adjusted under 35 U.S.C. 154(b) by 524 days.

(21) Appl. No.: 12/130,588

(22) Filed: May 30, 2008

(65) Prior Publication Data

US 2009/0254296 A1     Oct. 8, 2009

(30) Foreign Application Priority Data

Apr. 8, 2008   (TW) ................................ 97205931 U

(51) Int. Cl.
*G01R 31/28*     (2006.01)

(52) U.S. Cl. .......... 702/117; 702/85; 702/107; 702/120; 702/121; 714/718; 714/724; 714/725; 714/735; 714/742; 714/738; 324/74; 324/73.1; 324/537; 324/762.03; 324/750.01; 324/762.02; 324/756; 324/765; 716/106; 716/136

(58) Field of Classification Search .................. 702/85, 702/107, 117, 120, 121; 714/718, 724, 725, 714/735, 742, 738; 324/74, 73.1, 758, 754.14, 324/756.03, 130, 537, 756.02, 762.03, 750, 1, 762.02, 756, 765; 438/14, 17; 716/106, 136

See application file for complete search history.

(56) References Cited

U.S. PATENT DOCUMENTS

| | | | |
|---|---|---|---|
| 4,764,925 A * | 8/1988 | Grimes et al. ................. | 714/743 |
| 5,875,198 A * | 2/1999 | Satoh ............................. | 714/740 |
| 6,101,622 A * | 8/2000 | Lesmeister .................... | 714/724 |
| 6,157,200 A * | 12/2000 | Okayasu .................. | 324/754.23 |
| 6,243,841 B1 * | 6/2001 | Mydill .......................... | 714/724 |
| 6,377,065 B1 * | 4/2002 | Le et al. ................... | 324/750.01 |
| 6,380,730 B1 * | 4/2002 | Arkin et al. .............. | 324/750.01 |
| 6,801,869 B2 * | 10/2004 | McCord ........................ | 702/117 |
| 2009/0113260 A1 * | 4/2009 | Teng et al. .................... | 714/724 |
| 2009/0121726 A1 * | 5/2009 | Hashimoto .................. | 324/537 |
| 2010/0079159 A1 * | 4/2010 | Kemmerling ................. | 324/754 |

* cited by examiner

*Primary Examiner* — Carol S Tsai

(74) *Attorney, Agent, or Firm* — Muncy, Geissler, Olds & Lowe, PLLC

(57) ABSTRACT

A circuit testing apparatus for testing a device under test is disclosed. The device under test comprises a first output end and second output end for generating a first output signal and a second output signal, respectively. The circuit testing apparatus determines a test result for the device under test according to the first output signal and the second output signal.

15 Claims, 3 Drawing Sheets the second output signal $S_2$. The

CIRCUIT TESTING APPARATUS

BACKGROUND OF THE INVENTION

1. Field of the Invention

The invention relates to a circuit testing apparatus, and more particularly to a circuit testing apparatus for measuring a differential output of a device under test.

2. Description of the Related Art

With the development of technology, integrated circuits (ICs) have become more powerful and important. In addition to integrated circuits processing specifically analog or digital signals, mixed-signal integrated circuits are being developed to process both analog and digital signals. Regardless of processing type, manufactures generally test each integrated circuit to ensure quality. Further, according to the integrated circuit test results, manufacturers determine whether the integrated circuit is qualified for distribution.

FIG. 1 is a diagram illustrating differential voltage output of an integrated circuit tested by a logic tester. As shown in FIG. 1, a common testing method used during mass production of an integrated circuit is exemplified. Generally, a logic tester 10 is used as a testing apparatus of the device under test 12 (for example, an integrated circuit) before leaving the factory. For convenience of testing, the device under test 12 is usually disposed on a device under test board 14. When the logic tester 10 measures a differential voltage of the device under test 12 with two output ends $N_1$ and $N_2$, a testing signal $S_T$ is provided for the device under test 12. Then a first output voltage from the first output end $N_1$ of the device under test 12 corresponding to the testing signal $S_T$ is measured. Further a second output voltage from the second output end $N_2$ of the device under test 12 corresponding to the testing signal $S_T$ is measured. Accordingly, the logic tester 10 obtains a differential output of the device under test 12 by performing a subtraction calculation, which subtracts the second output voltage $V_{OUT-}$ of the second output end $N_2$ from the first output voltage $V_{OUT+}$ of the first output end $N_1$, so as to determine whether the device under test 12 has passed or failed the test with differential output. However, the above-mentioned testing method is performed by respectively measuring the first output voltage $V_{OUT+}$ and the second output voltage $V_{OUT-}$ via the logic tester 10, thereby requiring a relatively lengthy testing time, thus decreasing integrated circuit testing efficiency.

BRIEF SUMMARY OF THE INVENTION

Therefore, the invention provides a testing structure for improving the efficiency of integrated circuit testing, so to solve the deficiencies induced by conventional methods.

The invention provides a circuit testing apparatus for testing a device under test. The device under test comprises a first output end and a second output end for generating a first output signal and a second output signal, respectively, wherein the circuit testing apparatus determines a test result of the device under test according to the first output signal and the second output signal.

The circuit testing apparatus comprises a precision measure unit, a processing unit, a calculating unit and a processor. The precision measure unit coupled to the device under test provides a testing signal and receives a signal calculated result according to the testing signal. The processing unit coupled the first output end and the second output end of the device under test generates a first processing signal and a second processing signal according to the first output signal and the second output signal of the device under test. The calculating unit coupled to the processing unit receives the first processing signal and the second processing signal and generates the signal calculated result by processing the first processing signal and the second processing signal. The processor coupled to the precision measure unit determines the test result of the device under test according to the signal calculated result.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
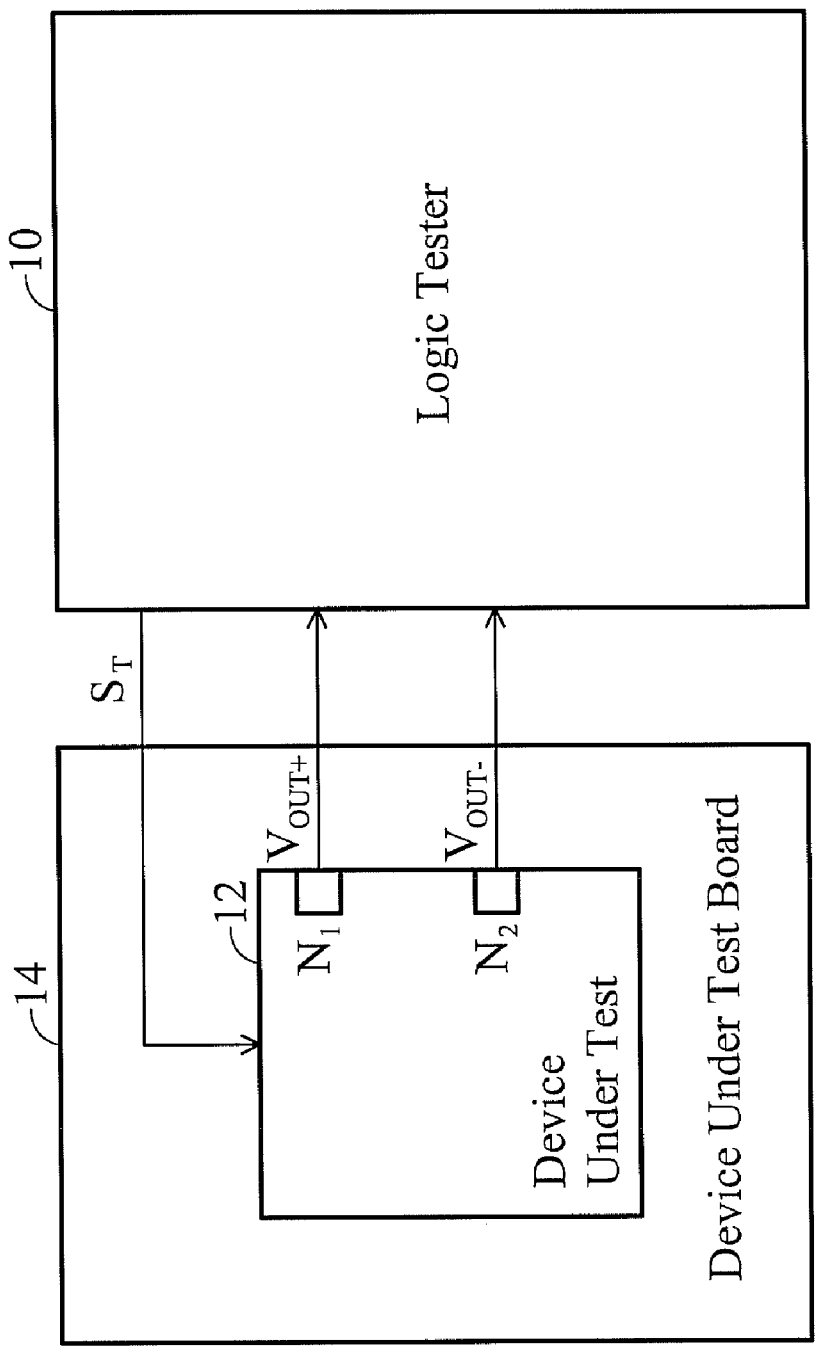
FIG. 1 is a diagram illustrating differential voltage output of an integrated circuit tested by a logic tester.
Figure 2:
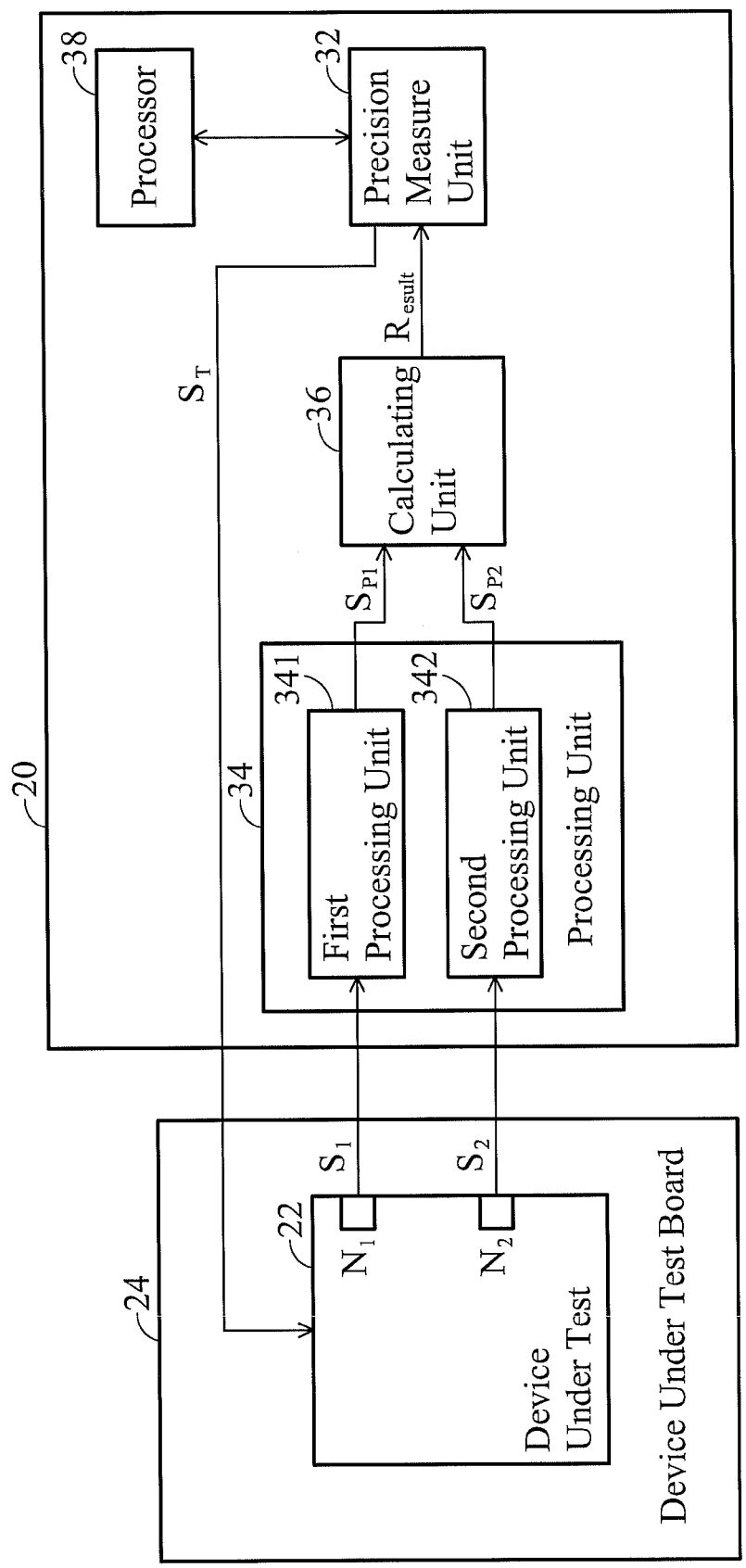
FIG. 2 is a block diagram of a circuit testing apparatus in accordance with the invention.

FIG. 2 is a block diagram of a circuit testing apparatus in accordance with the invention. As shown in FIG. 2, a circuit testing apparatus 20 according to the invention is provided for testing a device under test 22. For convenience of testing, the device under test 22 is generally installed on a device under test board 24. According to an embodiment of the invention, the device under test 22 is an integrated circuit. The device under test 20 comprises a first output end $N_1$ and a second output end $N_2$ for respectively generating a first output signal $S_1$ and a second output signal $S_2$. The circuit testing apparatus 20 determines a test result of the device under test 22 according to the first output signal $S_1$ and the second output signal $S_2$.

The circuit testing apparatus 20 comprises a precision measure unit 32, a processing unit 34, a calculating unit 36 and a processor 38. The precision measure unit 32 coupled to the device under test 22 provides a testing signal $S_T$ and receives a signal calculated result $R_{esult}$ according to the testing signal $S_T$. The processing unit 34 coupled to the first output end $N_1$ and the second output end $N_2$ of the device under test 22 generates a first processing signal $S_{P1}$ and a second processing signal $S_{P2}$ by processing the first output signal $S_1$ and the second output signal $S_2$ generated by the device under test 22 according to the testing signal $S_T$. The calculating unit 36 coupled to the processing unit 34 receives the first processing signal $S_{P1}$ and the second processing signal $S_{P2}$ and then generates the signal calculated result $R_{esult}$ by processing the first processing signal $S_{P1}$ and the second processing $S_{P2}$. The processor 38 coupled to the precision measure unit 32 determines the test result of the device under test 22 according the signal calculated result $R_{esult}$.

In addition, the processing unit 34 comprises a first processing unit 341 and a second processing unit 342. The first processing unit 341 coupled to the first output end $N_1$ of the device under test 22 generates the first processing signal $S_{P1}$ by processing the first output signal $S_1$. The second processing unit 342 coupled to the first output end $N_2$ of the device under test 22 generates the second processing signal $S_{P2}$ by processing the second output signal $S_2$. Moreover, the first processing unit 341 and the second processing unit 342 respectively buffer and amplify the first output signal $S_1$ and the second output signal $S_2$ to generate the first processing signal $S_{P1}$ and the second processing signal $S_{P2}$.

Figure 3:
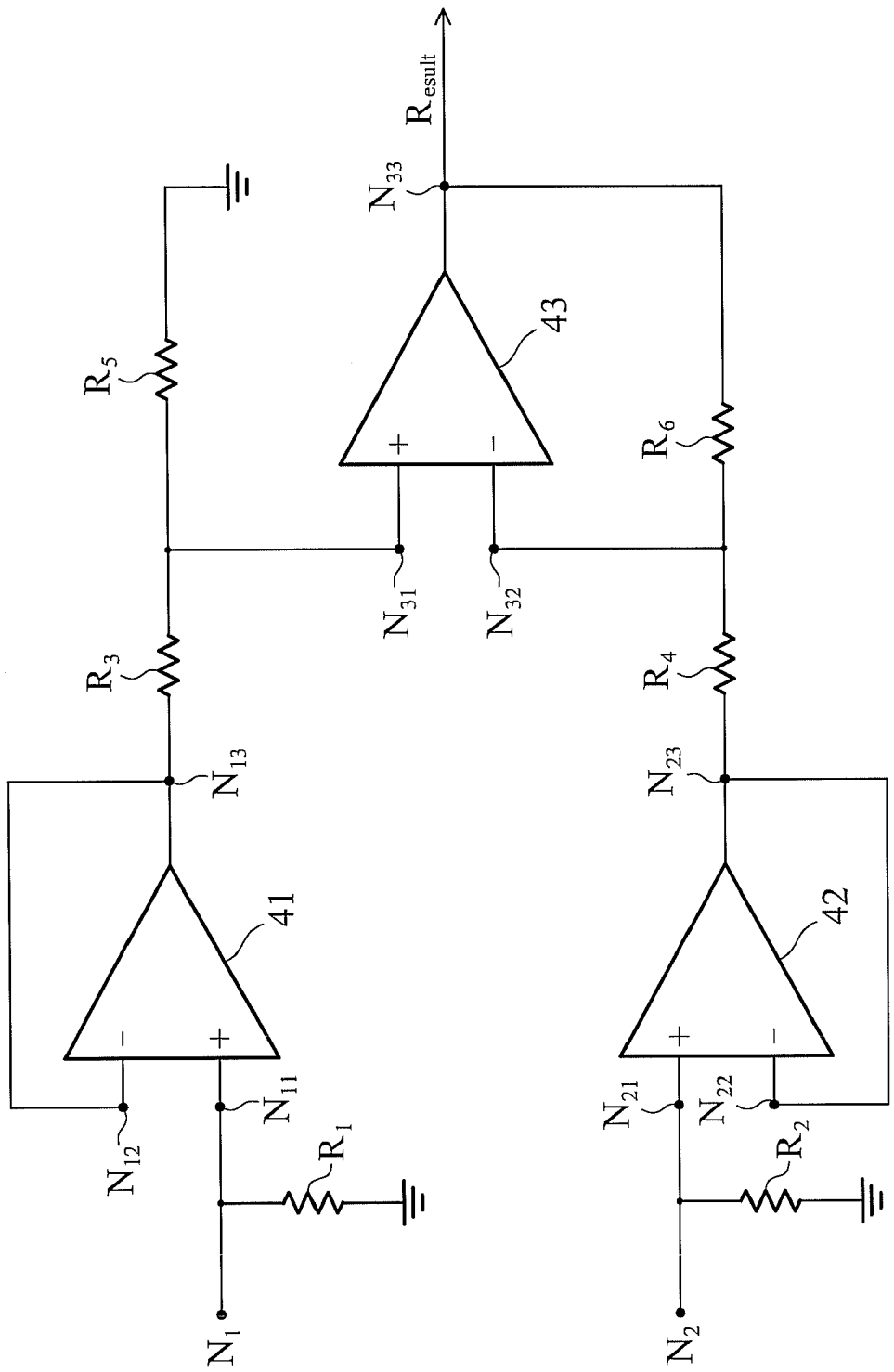
FIG. 3 is a diagram illustrating a processing unit and a calculating unit of a circuit testing apparatus according to an embodiment of the invention.

FIG. 3 is a diagram illustrating a processing unit and a calculating unit of a circuit testing apparatus according to an embodiment of the invention. As shown in FIG. 2 and FIG. 3, the first processing unit 341 and the second processing unit 342 are respectively buffers. The first processing unit 341 comprises a first amplifier 41 and a first resistor $R_1$. The first amplifier 41 comprises a first-first input end $N_{11}$, a first-second input end $N_{12}$, and a first output end $N_{13}$. The first-first input end $N_{11}$ is coupled to the first output end $N_1$ of the device under test 22. The first output end $N_{13}$ of the first amplifier 41 is coupled to the first-second output end $N_{12}$. One end of the first resistor $R_1$ is coupled between the first-first input end $N_{11}$ of the first amplifier 41 and the first output end $N_1$ of the device under test 22, and the other end of the first resistor $R_1$ is coupled to a ground end. The second processing unit 342 comprises a second amplifier 42 and a second resistor $R_2$. The second amplifier 42 comprises a second-first input end $N_{21}$, a second-second input end $N_{22}$, and a second output end $N_{23}$. The second-first input end $N_{21}$ of the second processing unit 342 is coupled to the second output end $N_2$ of the device under test 22. The second output end $N_{23}$ of the second amplifier 42 is coupled to the second-first input end $N_{21}$. One end of the second resistor $R_2$ is coupled between the second-second input end $N_{22}$ of the second amplifier 42 and the second output end $N_2$ of the device under test 22, and the other end of the second resistor $R_2$ is coupled to the ground end.

The calculating unit 36 performs a subtraction calculation between the first processing signal $S_{P1}$ and the second processing signal $S_{P2}$ for generating a signal calculated result $R_{esult}$. In an embodiment, the calculating unit 36 is a subtractor. The calculating unit 36 comprises a third resistor $R_3$, a fourth resistor $R_4$, a third amplifier 43, a fifth resistor $R_5$, and a sixth resistor $R_6$. One end of the third resistor $R_3$ is coupled to the first output end $N_{13}$ of the first amplifier 41. One end of the fourth resistor $R_4$ is coupled to the second output end $N_{23}$ of the second amplifier 42. The third amplifier 43 comprises a third-first input end $N_{31}$, a third-second input end $N_{32}$, and a third output end $N_{33}$. The third-first input end $N_{31}$ coupled to the other end of the third resistor $R_3$ receives the first processing signal $S_{P1}$. The third-second input end $N_{32}$ of the third amplifier 43 coupled to the other end of the fourth resistor $R_4$ receives the second processing signal $S_{P2}$. And, the third amplifier 43 generates a signal calculated result $R_{esult}$ by subtracting the second processing signal $S_{P2}$ from the first processing signal $S_{P1}$. The fifth resistor $R_5$ is coupled between the third-first end $N_{31}$ of the third amplifier 43 and the ground end. The sixth resistor $R_6$ is coupled between the third output end $N_{33}$ of the third amplifier 43 and the third-second input end $N_{32}$ thereof.

According to an embodiment of the invention, the signal calculated result $R_{esult}$ is a difference value, subtracting the second processing signal $S_{P2}$ from the first processing signal $S_{P1}$.

In addition, the circuit testing apparatus 20 further comprises a register (not shown) and a display unit (not shown), where the register (not shown) coupled the processor 38 stores the test result and the display unit (not shown) displays the test result of the device under test 22. Also, the circuit testing apparatus 20 is a logic tester. According to another embodiment of the invention, the precision measure unit 32 and the processor 38 are installed in a logic tester.

Among embodiments of the invention, the circuit testing apparatus utilizes the processing unit and the calculating unit to perform a subtraction calculation between the first output signal and the second output signal of the device under test so as to generate a signal calculated result. Moreover, the processor determines whether the device under test passes the test according to the signal calculated result so as to test the device under test. While it is necessary to measure the first output signal and the second output signal, respectively, according to prior art, the testing structure in accordance with the embodiments of the invention effectively improves chips testing speed, and further enhances testing efficiency, thereby providing advantages over conventional methods.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A circuit testing apparatus for testing a device under test, wherein the device under test comprises a first output end and a second output end for respectively generating a first output signal and a second output signal and determining a test result of the device under test according the first output signal and the second output signal, comprising:

a precision measure unit coupled to the device under test for providing a testing signal and receiving a signal calculated result according to the testing signal;

a processing unit coupled to the first output end and the second output end of the device under test for generating a first processing signal and a second processing signal by processing the first output signal and the second output signal of the device under test according the testing signal;

a calculating unit coupled to the processing unit for receiving the first processing signal and the second processing signal and generating the signal calculated result by calculating the first processing signal and the second processing signal; and a processor coupled to the precision measure unit for determining the test result of the device under test according the signal calculated result.

2. The circuit testing apparatus according to claim 1, wherein the processing unit comprises:

a first processing unit coupled the first output end of the device under test for generating the first processing signal by processing the first output signal; and a second processing unit coupled the second output end of the device under test for generating the second processing signal by processing the second output signal.

3. The circuit testing apparatus according to claim 2, wherein the first processing unit and the second processing unit buffer and amplify the first output signal and the second output signal, respectively, for generating the first processing signal and the second processing signal.

4. The circuit testing apparatus according to claim 3, wherein the first processing unit and the second processing unit are respectively buffers.

5. The circuit testing apparatus according to claim 3, wherein the first processing unit comprises:

a first amplifier comprising a first-first input end, a first-second input end and a first output end, wherein the first-first input end is coupled to the first output end of the device under test, and wherein the first output end is coupled to the first-second input end; and a first resistor with one end coupled between the first-first input end of the first amplifier and the first output end of the device under test, and with the other end coupled to a ground end.

6. The circuit testing apparatus according to claim 5, wherein the second processing unit comprises:
   a second amplifier comprising a second-first input end, a second-second input end and a second output end, wherein the second-first input end is coupled to the second output end of the device under test, and wherein the second output end is coupled to the second-second input end; and
   a second resistor with one end coupled between the second-first input end of the second amplifier and the second output end of the device under test, and with the other end coupled to the ground end.

7. The circuit testing apparatus according to claim 1, wherein the processing unit performs a subtraction calculation between the first processing signal and the second processing signal for generating the signal calculated result.

8. The circuit testing apparatus according to claim 7, wherein the calculating unit is a subtractor.

9. The circuit testing apparatus according to claim 7, wherein the calculating unit comprises:
   a third resistor with one end coupled to the first processing unit;
   a fourth resistor with one end coupled to the second processing unit;
   a third amplifier comprising a third-first input end, a third-second input end and a third output end, wherein the third-first end coupled to the other end of the third resistor receives the second processing signal, the third-second input end coupled to the other end of the fourth resistor receives the second processing signal, and the third amplifier generates the signal calculated result by subtracting the second processing signal from the first processing signal;
   a fifth resistor coupled between the third-first input end of the third amplifier and a ground end; and
   a sixth resistor coupled between the third output end of the third amplifier and the third-second input end of the third amplifier.

10. The circuit testing apparatus according to claim 7, wherein the signal calculated result is a difference value, subtracting the second processing signal from the first processing signal.

11. The circuit testing apparatus according to claim 1, wherein the circuit testing apparatus is a logic tester.

12. The circuit testing apparatus according to claim 1, wherein the device under test is an integrated circuit.

13. The circuit testing apparatus according to claim 1, wherein the precision measure unit and the processor are disposed in a logic tester.

14. The circuit testing apparatus according to claim 1, further comprising a register coupled to the processor for storing the test result.

15. The circuit testing apparatus according to claim 1, further comprising a display unit for displaying the test result.

* * * * *